United States Patent [19]

Ishii

[11] 4,408,184

[45] Oct. 4, 1983

[54] KEYBOARD SWITCH CIRCUIT

[75] Inventor: Jun Ishii, Yokohamashi, Japan

[73] Assignee: Tokoy Shibaura Denki Kabushiki Kaisha, Japan

[21] Appl. No.: 170,179

[22] Filed: Jul. 18, 1980

[30] Foreign Application Priority Data

Aug. 24, 1979 [JP] Japan .................. 54-107941

[51] Int. Cl.³ ............................................ G06F 3/02
[52] U.S. Cl. ........................... 340/365 S; 340/365 R; 340/825.79
[58] Field of Search ............ 340/365 R, 365 E, 365 S, 340/166 R, 825.79, 825.89; 178/17 C; 179/90 K

[56] References Cited

U.S. PATENT DOCUMENTS 4,231,016 10/1980 Ueda .............................. 340/365 E
4,234,871 11/1980 Guglielmi et al. .............. 340/365 S

FOREIGN PATENT DOCUMENTS 1210612 10/1970 United Kingdom ............ 340/365 S

Primary Examiner—James J. Groody
Attorney, Agent, or Firm—Finnegan, Henderson, Farabow, Garrett & Dunner

[57] ABSTRACT

A keyboard switch circuit for directly obtaining binary coded signals. The keyboard has $2^m$ columns and two or more rows which are connected to a sequential timing source. The rows and columns are selectively connected to inputs of the gate groups for outputting each bit code of binary coded signals associated with respective keys. The inputs of the gates associated with any one of the bit codes are connected to the columns or rows which are connected to the keys having the same bit code as the gates.

34 Claims, 20 Drawing Figures

KEYBOARD SWITCH CIRCUIT

FIELD OF THE INVENTION

This invention relates to a keyboard switch circuit for producing binary coded signals.

BACKGROUND OF THE INVENTION

Keyboard switch circuits are generally used as commander units for many kinds of electronic appliances, e.g., calculators, computors, or other key-operated machines.

In typical conventional keyboard switch circuits, as many comparators as keys are usually required and many connections are necessary for connecting the comparators to rows and columns of the keyboard matrix. As a result, known keyboard circuits have several disadvantages. First, large numbers of logic gates are required. Second, the wiring of the elements is correspondingly more complicated. Third, the known circuits cannot directly obtain the binary coded signals associated with the respective keys.

SUMMARY OF THE INVENTION

Accordingly, an object of the present invention is to provide a keyboard switch circuit having fewer gates and less complicated wiring.

A second object of this invention is to provide a keyboard switch circuit which is able to obtain binary coded directly.

According to the present invention, a keyboard switch circuit comprises (a) a switch matrix circuit including $2^m$ columns and more than 2 rows where m represents a positive integer, the switch matrix circuit further including key switches equal in number to the product of the number of columns and rows, each switch being connected across a particular one of the columns and a particular one of the rows, (b) a first circuit for sequentially applying pulses to respective rows, (c) a first set of m gates associated with the columns, for m=1, the OR gate being replaceable by a conductor, (d) a second set of n logic gates associated with the rows, where n represents a positive integer, (e) a third set of logic gates having first and second inputs, the first input being connected to the respective outputs of the n logic gates, and (f) an OR gate having inputs connected to all columns, and an output connected to the second input of the n logic gates.

Additional objects and advantages of the present invention will become apparent to persons skilled in the art from a study of the following description of the accompanying drawings in which:

DESCRIPTION OF THE PREFERRED EMBODIMENTS

Figure 1:
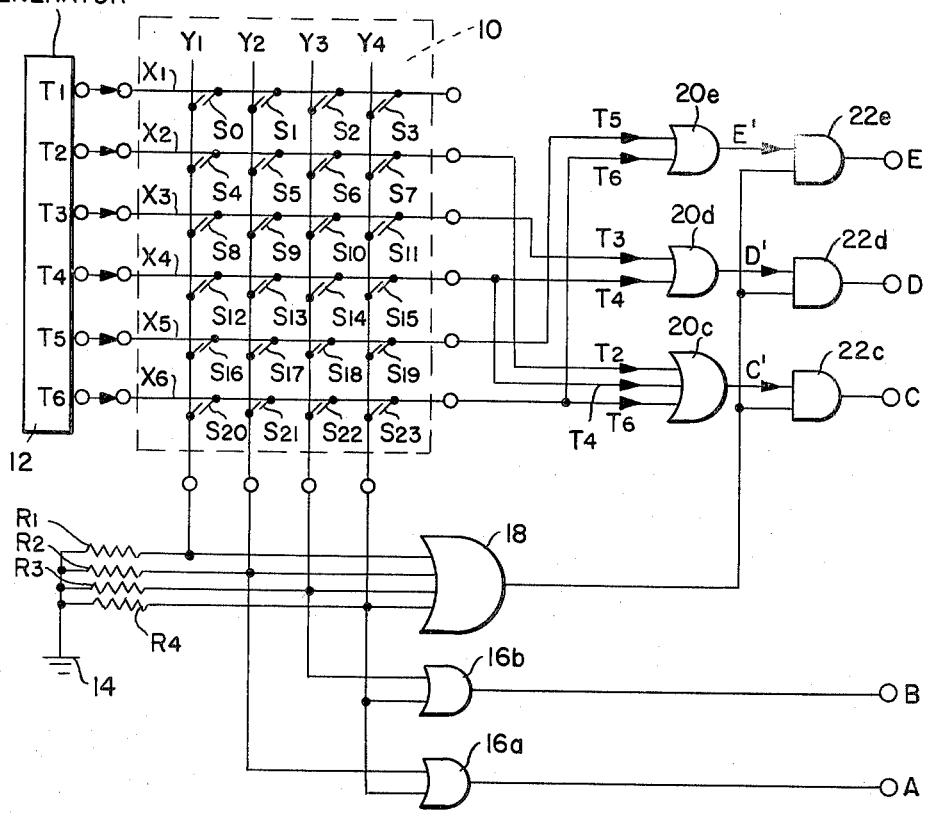
FIG. 1 shows a circuit diagram of a keyboard switch circuit embodying the present invention.

The present invention will be described in detail with the accompanying drawings FIGS. 1 to 20. Throughout the drawings, like reference numerals will designate like or equivalent portions, for simplicity of explanation.

The keyboard switch circuit of the present invention encompasses a switch matrix circuit having $2^m$ columns, where m is a positive integer, and 2 or more rows. Within the scope of the present invention, there are three discrete cases defined by the number of rows in the matrix. In a first case the number of rows falls in the range of $(2^{n-1}+2)$ to $2^n$ (e.g., the embodiment of FIG. 1). In a second case the number of rows in the matrix is equal to $2^n+1$ (e.g., the embodiment of FIG. 3). The third case is the special case of 2 or 3 rows. Also, the special cases of 2 columns only will be described.

First, the embodiment having $2^m$ columns and a number of rows in the range $(2^{n-1}+2)+2^n$ is explained. Referring now to FIG. 1, a keyboard switch circuit of one embodiment of this invention is shown where m=2 and n=3.

A switch matrix circuit 10 is provided with four columns $Y_1$, $Y_2$, $Y_3$ and $Y_4$ and six rows $X_1$, $X_2$, $X_3$, $X_4$, $X_5$ and $X_6$. That is, the switch matrix circuit 10 is provided with $2^2$ columns and between $2^{3-1}+2$ and $2^3$ rows. The circuit 10 is further provided with 24 (6 rows×4 columns) key switches, each being connected across a particular one of the columns and a particular one of the rows. A different decimal integer is associated with each of these key switches. For example, the decimal integer $(0)_{10}$ is associated with the key switch connected across row $X_1$ and column $Y_1$ (i.e., switch $S_o$), the decimal integer $(10)_{10}$ is associated with the key switch connected across row $X_3$ and column $Y_3$ (i.e., $S_{10}$) and so on.

Figure 2:
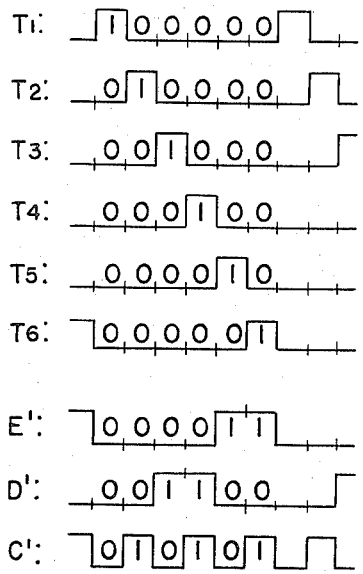
FIG. 2 shows the timing signals' wave forms and the output signals on the respective OR gates associated with the embodiment of FIG. 1.

The rows $X_1$, $X_2-X_6$ are individually connected to the output terminals of a ring counter 12 which sequentially applies timing signals $T_1$, $T_2$, $T_3$, $T_4$, $T_5$ and $T_6$ to the associated rows $X_1$, $X_2-X_6$. These signals $T_1$, $T_2-T_6$ are 6-bit pulses which have wave forms as shown in FIG. 2; for example, the timing signal $T_1$ represents 100000.

The columns $Y_1$, $Y_2$, $Y_3$ and $Y_4$ are individually connected to the ground terminal 14 through resistors $R_1$, $R_2$, $R_3$ and $R_4$ so that when any key switch, for example, the switch $S_{10}$ is operated, the timing signal $t_3$ on the row $X_3$ is applied to the column $Y_3$.

A first set of OR gates, for example, non-inverted OR gates 16a and 16b is provided for selectively taking the signals $T_1$ to $T_4$ out through the columns $Y_2$ to $Y_4$. Each j gate of this first set of OR gates, where j is the positive integer sequentially identifying the gate from one to m has inputs selectively connected to every $2^{j-1}$ columns at intervals of the same $2^{j-1}$ columns. For instance, first (j=1) gate 16a has two inputs selectively connected to one column at intervals of the same one column where j=1, i.e., one input being connected to the column ($Y_2$) which is associated with the key switches $S_1$, $S_5$, $S_9$, $S_{13}$, $S_{17}$, and $S_{21}$ and the other input being connected to the column $Y_4$ which is associated with the key switches $S_3$, $S_7$, $S_{11}$, $S_{15}$, $S_{19}$, and $S_{23}$. Second (j=2) gate 16b also has two inputs selectively connected to two columns at intervals of the same two columns where j=2, i.e., one input being connected to the column $Y_3$ which is associated with the key switches $S_2$, $S_6$, $S_{10}$, $S_{14}$, $S_{18}$ and $S_{22}$, and the other input being connected to the column $Y_4$ in common with the second input of gate 16a.

Further, a four input non-inverted OR gate 18 is provided. Respective inputs of the gate 18 are connected to the columns $Y_1$, $Y_2$-$Y_4$, respectively.

A second set of non-inverted OR gates 20c, 20d and 20e are provided for selectively taking the signals $T_2$ to $T_6$ out through the rows $X_2$ to $X_6$. Each k gate of this second set of OR gates, where k is the positive integer sequentially identifying the gate from one to n, has inputs selectively connected to every $2^{k-1}$ rows at intervals of $2^{k-1}$ rows. First (k=1) gate 20c has three inputs selectively connected to every one row at intervals of the same one row, i.e., one input being connected to the row $X_2$ which is associated with the key switches $S_4$, $S_5$, $S_6$ and $S_7$, another input being connected to the row $X_4$ which is associated with the key switches $S_{12}$, $S_{13}$, $S_{14}$ and $S_{15}$ and the third input being connected to the row $X_6$ which is associated with the key switches $S_{20}$, $S_{21}$, $S_{22}$ and $S_{23}$. Second (k=2) gate 20d has two inputs selectively connected to every two rows at intervals of the same two rows where k=2, i.e., one input being connected to the row $X_3$ which is associated with the key switches $S_8$, $S_9$, $S_{10}$, and $S_{11}$ and the other input being connected to the row $X_4$, in common with the second input of the gate 20c. The third (k=3) gate 20e also has two inputs selectively connected to every three rows at intervals of the same three rows where k=3, i.e., one input being connected to the row $X_5$ which is associated with the key switches $S_{16}$, $S_{17}$, $S_{18}$ and $S_{19}$, and other input being connected to the row $X_6$ in common with the last input of the gate 20c. The third gate 20e does not have three inputs but only two inputs in spite of k=3 because the switch matrix circuit 10 has no more than 6 rows.

Respective outputs of the OR gates of the second group are coupled to the inputs of logic gates, for example, non-inverted AND gates 22c, 22d, and 22e. The other inputs of these AND gates are coupled in common to the output of the OR gate 18.

The outputs A, B, C, D and E provide the output binary coded signal. The output A represents the least significant data (LSD), and the output E represents the most significant digit (MSD).

In operation, when a key on either column $Y_2$ or $Y_4$ is operated, the respective timing signal associated with the particular row appears at the output A of the gate 16a. Again, when a key on either column $Y_3$ or $Y_4$ is operated, the respective timing signal associated with the particular row appears at the output B of the gate 16b. But, if a key on column $Y_1$ is operated, no timing signal appears at the output of any gate in the first OR gate group.

Now, a signal having a wave form C' shown in FIG. 2 always appears at the output of gate 20c, because signal C' is obtained as the logic sum of the timing signals $T_2$, $T_4$ and $T_6$. Likewise, signals D' and E' having the respective wave forms shown in FIG. 2 appear respectively on the output of gate 20a and the output of gate 20e. However, these output signals C', D' and E' are logically combined with the output of gate 18 at the respective AND gates 22c, 22d and 22e. Accordingly, at the output C, D or E, only the timing signal of the row corresponding to the operated key appears. That is, gate 18 works to select the timing signal of the row corresponding to the operated key from among the signals applied to the second group of OR gates 20c, 20d and 20e.

Accordingly, when one of the keys is operated, the binary coded signal corresponding to the same key's decimal integer is obtained from the outputs A, B, C, D and E as the combination of the logic conditions of the gates 16a, 16b, 20c, 20d and 20e. For example, when the key $S_1$ is operated, only the gate 16a turns to ON condition. Accordingly the logical state of the combination of the outputs A, B, C, D and E is $10000_2$ which equals $1_{10}$. Further, when the key $S_{15}$ is operated, the gates 16a, 16b, 20c and 20d turn to ON conditions and accordingly the logical state of the combination of the outputs A, B, C, D and E is $11110_2$ which equals $15_{10}$. In general, when any key is operated, the logical state of the combination of the outputs A, B, C, D and E becomes the binary coded integer which is equivalent to the decimal integer associated with the operated key.

The relationship between the respective keys and the logical state of the combinations of the outputs A, B, C, D and E corresponding to the time when the respective keys are operated, is shown in the following Truth Table.

| Key | A | B | C | D | E | Key | A | B | C | D | E |
| --- | --- | --- | --- | --- | --- | --- | --- | --- | --- | --- | --- |
| 0 | 0 | 0 | 0 | 0 | 0 | 12 | 0 | 0 | 1 | 1 | 0 |
| 1 | 1 | 0 | 0 | 0 | 0 | 13 | 1 | 0 | 1 | 1 | 0 |
| 2 | 0 | 1 | 0 | 0 | 0 | 14 | 0 | 1 | 1 | 1 | 0 |
| 3 | 1 | 1 | 0 | 0 | 0 | 15 | 1 | 1 | 1 | 1 | 0 |
| 4 | 0 | 0 | 1 | 0 | 0 | 16 | 0 | 0 | 0 | 0 | 1 |
| 5 | 1 | 0 | 1 | 0 | 0 | 17 | 1 | 0 | 0 | 0 | 1 |
| 6 | 0 | 1 | 1 | 0 | 0 | 18 | 0 | 1 | 0 | 0 | 1 |
| 7 | 1 | 1 | 1 | 0 | 0 | 19 | 1 | 1 | 0 | 0 | 1 |
| 8 | 0 | 0 | 0 | 1 | 0 | 20 | 0 | 0 | 1 | 0 | 1 |
| 9 | 1 | 0 | 0 | 1 | 0 | 21 | 1 | 0 | 1 | 0 | 1 |
| 10 | 0 | 1 | 0 | 1 | 0 | 22 | 0 | 1 | 1 | 0 | 1 |
| 11 | 1 | 1 | 0 | 1 | 0 | 23 | 1 | 1 | 1 | 0 | 1 |

The table shows that the output A for bit A of the binary integer can be associated only with key switches $S_1$, $S_3$, $S_5$, $S_7$, $S_9$, $S_{11}$, $S_{15}$, $S_{17}$, $S_{19}$, $S_{21}$, and $S_{23}$, the output B can be associated only with key switches $S_2$, $S_3$, $S_6$, $S_7$, $S_{10}$, $S_{11}$, $S_{14}$, $S_{15}$, $S_{18}$, $S_{19}$, $S_{22}$, and $S_{23}$, the output C can be associated only with key switches $S_4$, $S_5$, $S_6$, $S_7$, $S_{12}$, $S_{13}$, $S_{14}$, $S_{15}$, $S_{20}$, $S_{21}$, $S_{22}$ and $S_{23}$, the output D can be associated only with key switches $S_8$, $S_9$, $S_{10}$, $S_{11}$, $S_{12}$, $S_{13}$, $S_{14}$, and $S_{15}$, and the output E can be associated only with key switches $S_{16}$, $S_{17}$, $S_{18}$, $S_{19}$, $S_{20}$, $S_{21}$, and $S_{23}$. These coupling relationships between the outputs and the key switches is achieved by the arrangement of gates. For example, the output A can be connected to column $Y_2$ having the key switches $S_1$, $S_5$, $S_9$, $S_{13}$, $S_{17}$ and $S_{21}$ on it and column $Y_4$ having the key switches $S_3$, $S_7$, $S_{11}$, $S_{15}$, $S_{19}$, $S_{23}$ on it via two inputs to gate 16a, respectively. For one more example, the output C can be connected to row $X_2$ having the key switches $S_4$, $S_5$, $S_6$ and $S_7$ on it, row $X_4$ having the key switches $S_{12}$, $S_{13}$, $S_{14}$, and $S_{15}$ on it and row $X_6$ having the key switches $S_{20}$, $S_{21}$, $S_{22}$, and $S_{23}$ on it.

By using the basic relationships between the bit outputs and the keys, many embodiments of the present invention are obtained.

Figure 3:
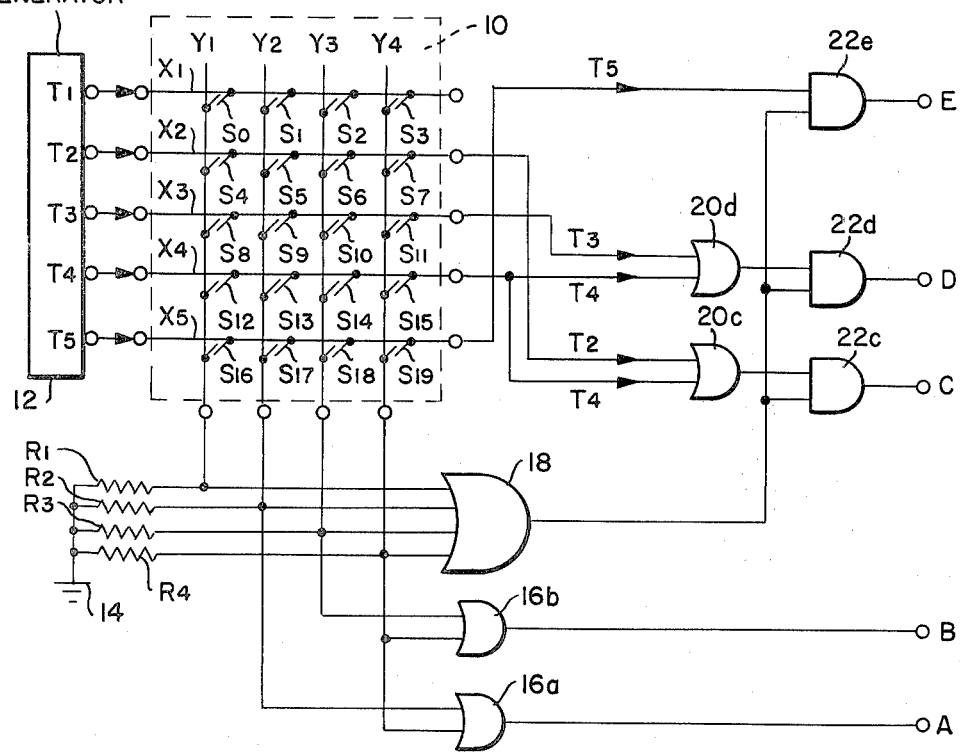
FIG. 3 to FIG. 7 show circuit diagrams of other keyboard switch circuits embodying the present invention.

Another embodiment having $2^m$ columns and $2^n+1$ rows is explained. This embodiment also relies on the above basic relationship designated as the second case. Referring to FIG. 3, a keyboard switch circuit having 4 columns and 5 rows is shown where m=2 and n=2. The embodiment of FIG. 3 is different from that of FIG. 1 in respect that the number of rows is fewer by one than that of FIG. 1. As a result, the output E can be connected only to row $X_5$ having the key switches $S_{16}$, $S_{17}$, $S_{18}$ and $S_{19}$ on it. Under this condition, row $X_5$ may be directly connected to AND gate 22e and not through any OR gate like the OR gate 20e in FIG. 1.

Figure 4:
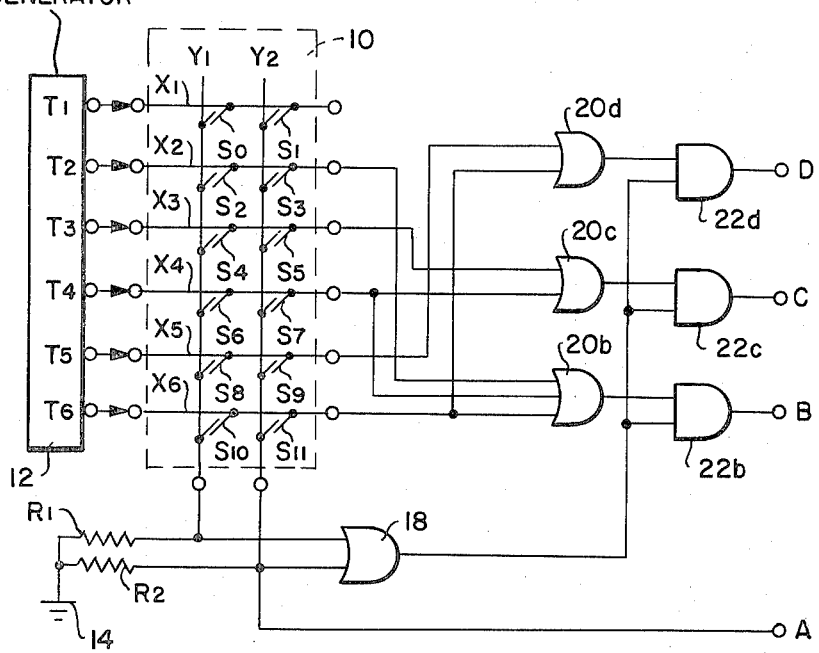

Another embodiment having 2 columns and between $(2^{n-1}+2)$ to $2^n$ rows is explained. This embodiment also has the above basic relationship. Referring to FIG. 4, a keyboard switch circuit having 2 columns and 6 rows is shown where n=3. The embodiment of FIG. 4 is different from the circuit in FIG. 1 in respect that it has only two columns. As a result, the output A is associated only with the one column $Y_2$ having the key switches $S_1$, $S_3$, $S_5$, $S_7$ and $S_9$ on it. In this condition, the output A may be directly connected to the column $Y_2$.

Figure 5:
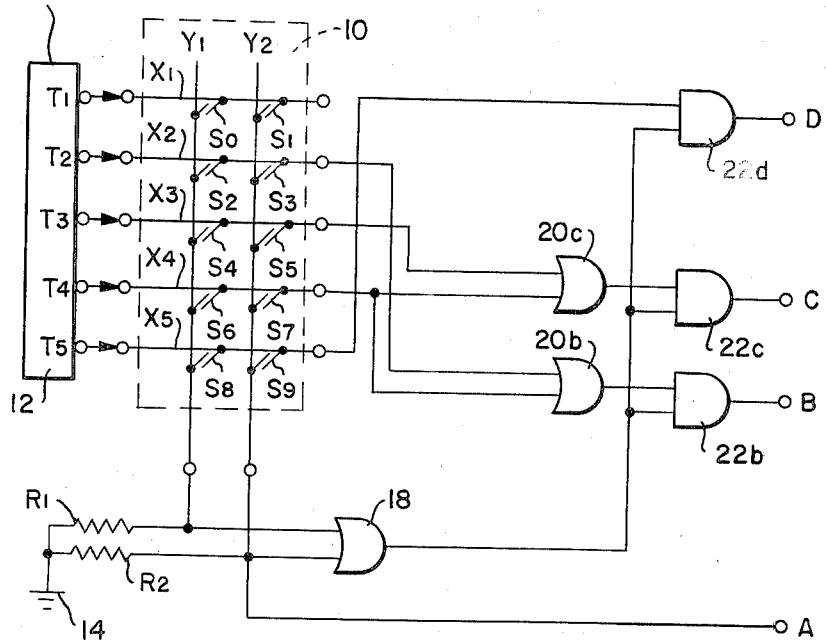

Still another embodiment as shown in FIG. 5 having 2 columns and $(2^n+1)$ rows is explained. Referring to FIG. 5, a keyboard switch circuit having 2 columns and 5 rows is shown where n=2. The embodiment of FIG. 5 is different from that of FIG. 4 with respect that the number of rows is fewer by one than that of the FIG. 4 circuit, but same as FIG. 3 with respect to the number of rows. The row $X_5$ is directly connected to the AND gate 22d and not via any OR gate.

Figure 6:
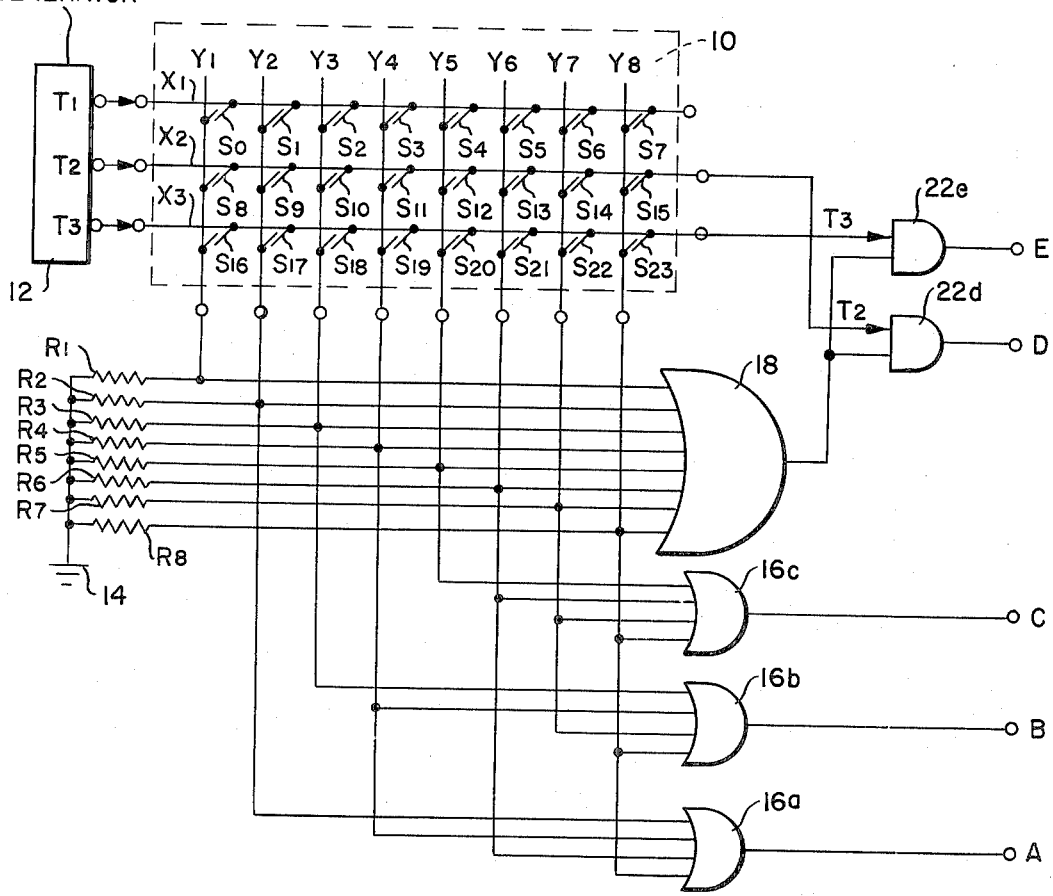

Still a further embodiment having $2^m$ columns and 2 to 3 rows is explained. Referring to FIG. 6, a keyboard switch circuit having 8 columns and 3 rows is shown where m=3.

In this case, a switch matrix circuit 10 is provided with 24 key switches similar to FIG. 1, except that it has three rows, i.e., $X_1$, $X_2$, and $X_3$, eight columns $Y_1$, $Y_2$, $Y_3$, $Y_4$, $Y_5$, $Y_6$, $Y_7$ and $Y_8$, each key switch being connected across a particular one of the columns and a particular one of the rows.

For taking the A bit output, a first input of the four input non-inverted OR gate 16a is connected to column $Y_2$ having the key switches $S_1$, $S_9$ and $S_{17}$ on it; a second input is connected to column $Y_4$ having the key switches $S_3$, $S_{11}$, and $S_{19}$ on it; a third input is connected to column $Y_6$ having the key switches $S_5$ and $S_{13}$ and $S_{21}$ on it; and a fourth input is connected to column $Y_8$ having the key switches $S_7$, $S_{15}$, and $S_{23}$ on it. That is, four inputs to gate 16a are selectively connected to every other column, i.e., at intervals of one column where j=1.

For taking the B bit output, a first input of the four input non-inverted OR gate 18b is connected to column $Y_3$ having the key switches $S_2$, $S_{10}$ and $S_{18}$ on it; a second input is connected to column $Y_4$; a third input is connected to column $Y_7$ having the key switches $S_6$, $S_{14}$ and $S_{22}$ on it; and a fourth input is connected to column $Y_8$. That is, four inputs of gate 16b are selectively connected to every two columns at intervals of two columns where j=2.

For taking the C output, a first input of a four-input non-inverted OR gate 16c is connected to column $Y_5$ having the key switches $S_4$, $S_{12}$ and $S_{20}$ on it; a second input is connected to column $Y_6$; a third input is connected to column $Y_7$; and a fourth input is connected to column $Y_8$. That is, four inputs of gate 16c are selectively connected to every four columns at intervals of the same four columns where j=3.

On the other hand, for taking the D bit output, a first input of the two-input non-inverted AND gate 22a is connected to row $X_2$ having key switches $S_8$, $S_9$, $S_{10}$, $S_{11}$, $S_{12}$, $S_{13}$, $S_{14}$, and $S_{15}$. For taking the E bit output, a first input of a two-input non-inverted AND gate 22e is connected to row $X_3$ having key switches $S_{16}$, $S_{17}$, $S_{18}$, $S_{19}$, $S_{20}$, $S_{21}$, $S_{22}$ and $S_{23}$ on it.

The first to eight inputs of a eight-input non-inverted OR gate 18 are connected to columns $Y_1$, $Y_2$, $Y_3$, $Y_4$, $Y_5$, $Y_6$, $Y_7$ and $Y_8$, and the output of gate 18 is connected to respective second inputs of gates 22d and 22e.

In the case of the FIG. 6 embodiment, OR gates such as gates 20d to 20e in FIG. 1 are omitted because the D bit output and E bit output are referred to the keys on only one row $X_2$ or $X_3$. A timing generator 12 can be a ring counter for supplying timing signals to the switch matrix circuit 10, and thus is simpler than the timing generator of FIG. 1 because only three timing signals $T_1$, $T_2$ and $T_3$ are required for the three rows.

Figure 7:
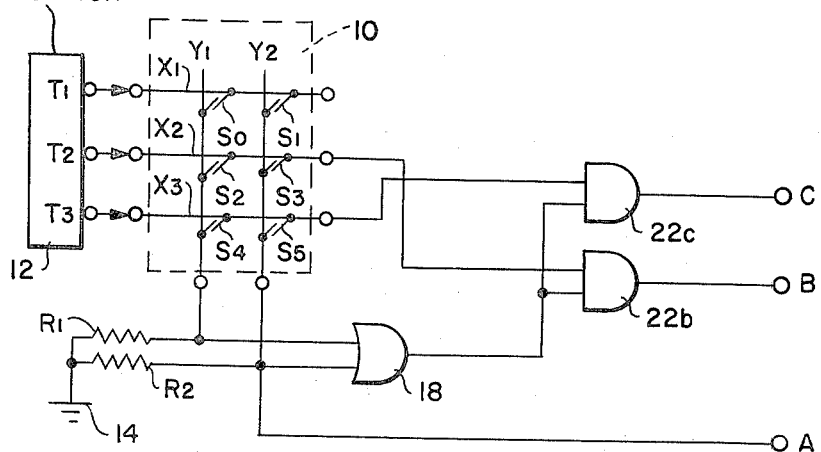

Still a further embodiment having 2 columns and 2 to 3 rows is explained. Referring to FIG. 7, a keyboard switch circuit having 2 columns and 3 rows is shown. FIG. 7 is similar to the embodiment of FIG. 4 in respect to the number of columns, and also similar to the FIG. 6 in respect of the number of rows. Similar to the embodiment of FIG. 4, the output A is directly connected to only column $Y_2$ having the key switches $S_1$, $S_3$ and $S_5$. Similar to the embodiment of FIG. 6, row $X_2$ having the key switches $S_2$ and $S_3$ and row $X_3$ having the keys $S_4$ and $S_5$ are directly connected to the respective AND gates 22b and 22c respectively associated with the outputs B and C.

Referring to the above embodiments, the present invention may be applied to a switch matrix circuit having $2^m$ columns and more than two rows connected to the sequential pulses supplying circuit where m represents a positive integer. The number of rows is two or more, but generally represented as the number from $(2^{n-1}+2)$ to $2^n$ or the number $2^n+1$ where n also represents a positive integer, while the number of columns is restricted to a number of m power of two $2^m$. All the columns except one are connected to a first set of m OR gates and the rows except one also are connected to a second set of n OR gates. The jth gate in the first set of OR gates has inputs respectively connected to every $2^{j-1}$ columns at intervals of $2^{j-1}$ columns, where j represents a positive integer from one to m. For example, the inputs of the first OR gate (j=1) in the first set of OR gates are respectively connected to the columns $Y_2$, $Y_4$, $Y_6$ and $Y_8$ and so on, and inputs of the second OR gate (j=2) in the first set of OR gates respectively, are connected to the columns $Y_3$, $Y_4$, $Y_7$ and $Y_8$ and so on. Similarly, the kth OR gate in the second set of the gates has inputs respectively connected to every $2^{k-1}$ rows at intervals of $2^{k-1}$ rows where k represents a positive integer from one to n. For example, the inputs of the first OR gate (k=1) in the second set of gates are respectively connected to the rows $X_2$, $X_4$, $X_6$, $X_8$ and so on, the inputs of the second OR gate (k=2) in the second set of gates are respectively connected to the rows $X_3$, $X_4$, $X_7$, $X_8$ and so on. But in particular cases, a column or row may be associated with only one particular bit output such as the output A in FIGS. 4, 5 and 7, the output D in FIG. 5, the outputs D and E in FIG. 6 and the outputs B and C in FIG. 7, and so no OR gate associated with the output is needed.

The above embodiments may be modified to various forms by changing the non-inverted OR gates or the non-inverted AND gates to inverted OR gates.

Figure 8:
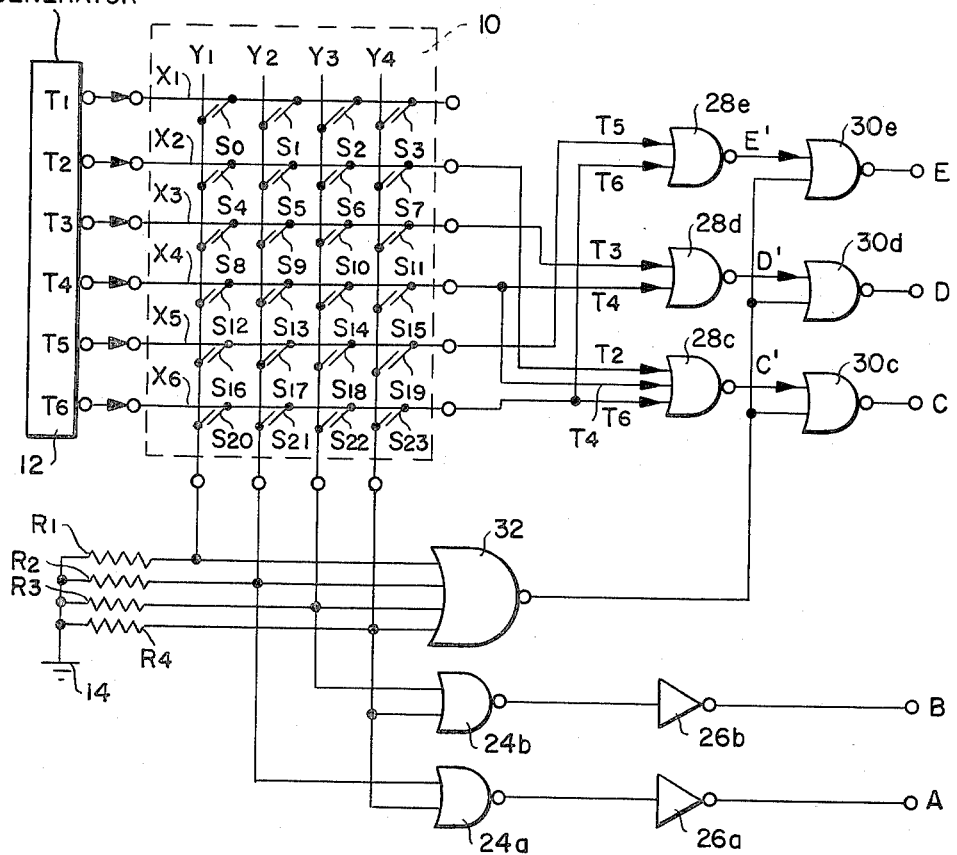
FIG. 8 shows one modification from the keyboard switch circuit shown in FIG. 1.

FIG. 8 shows one of the modifications from the keyboard switch circuit shown in FIg. 1 where all of the non-inverted OR gates and the non-inverted AND gates in FIG. 1 are changed to inverted OR gates. The circuit shown in FIG. 8 further comprises two inverters 26a and 26b. That is, gates for taking bit outputs out of a keyboard matrix circuit 10 having four columns $Y_1$, $Y_2$, $Y_3$ and $Y_4$ and six rows $X_1$, $X_2$, $X_3$, $X_4$, $X_5$ and $X_6$ are constructed using inverted OR gates and inverters and not using any AND gates. For example, for taking an A bit output out, two inputs of an inverted OR gate 24a are connected to the columns $Y_2$ and $Y_6$, respectively. The A bit output is taken out from an output of gate 24a via inverter 26a. When a key on the columns $Y_2$ or $Y_4$ is operated, the output of the gate 24a is in an OFF condition, this OFF conditon of the output is transformed to an ON condition by means of the inverter 26a. A B bit output also is taken out from an output of an inverted OR gate 24b connected to the columns $Y_3$ and $Y_4$ via an inverter 26b similar to the A bit output.

On the other hand, for taking a C bit output out, three inputs of an inverted OR gate 28c, are connected to the rows $X_2$, $X_4$ and $X_6$, respectively. Similarly, respective two inputs of inverted OR gates 28d and 28e are connected to the rows $X_3$, $X_4$, $X_5$, and $X_6$ for taking D and E bit outputs out. Outputs of these gates 28c, 28d and 28e are connected to respective first inputs of two-input inverted OR gates 30c, 30d and 30e.

Second inputs of these gates 30c, 30d and 30e are connected in common to an output of a four-input inverted OR gate 32 of which four inputs are respectively connected to the columns $Y_1$, $Y_2$, $Y_3$ and $Y_4$.

Figure 9:
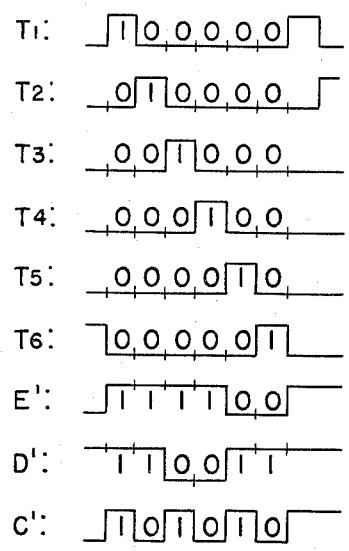
FIG. 9 shows wave forms of timing signals and the output signals on the respective OR gates associated with the embodiment of FIG. 8.

Timing signals $T_1$, $T_2$, $T_3$, $T_4$, $T_5$ and $T_6$ which have wave forms shown in FIG. 9 are applied from a ring counter timing generator 12 to the respective rows. Accordingly, signals having respective wave forms C', D' and E' as shown in FIG. 9 appear at the outputs of the gates 28c, 28d and 28e. And the inverted signal of the timing signal of the row corresponding to the operated key appears at the output of the gate 32, and is applied to the second inputs of the gates 30c, 30d and 30e. As a result, when one of the keys on the rows $X_2$ to $X_6$ is operated, a signal equivalent to the timing signal of the row associated with the operated key appears at the outputs C, D or E.

Accordingly, even by the circuit as shown in FIG. 8, binary integers corresponding to the key decimal integers or other codes are obtained from the outputs A, B, C, D and E as a combination of the logic conditions of the gates 24a, 24b, 30c, 30d, and 30e.

Figure 10:
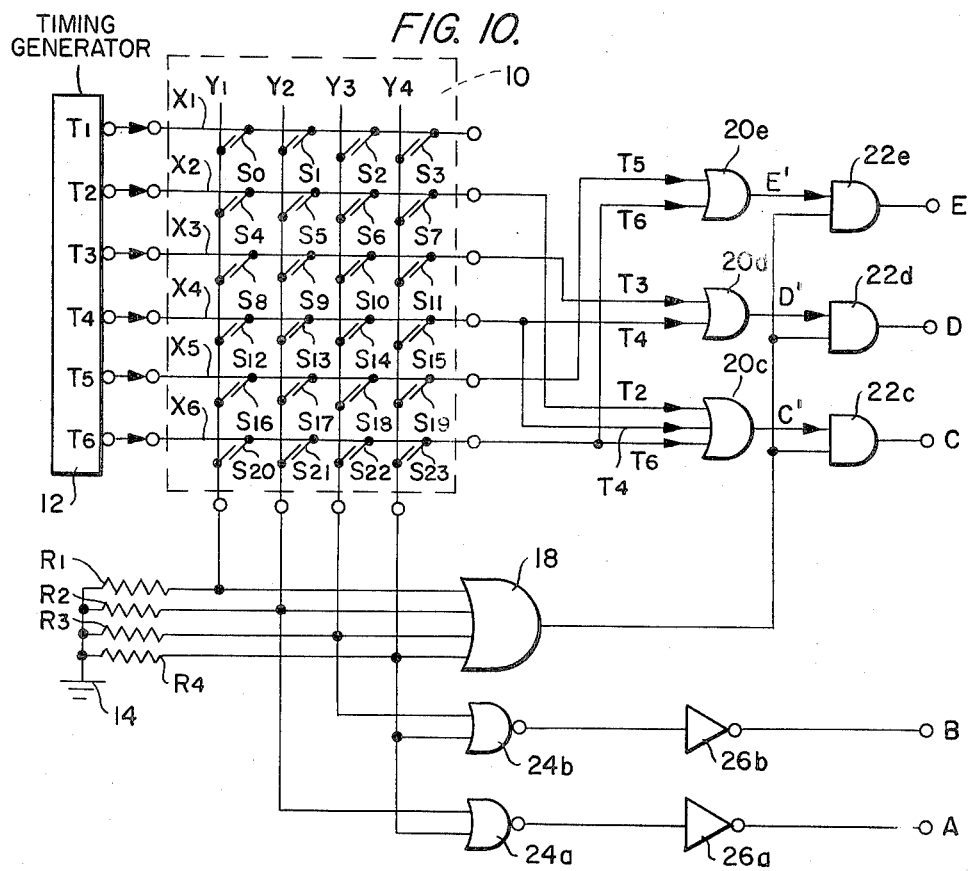
FIG. 10 and FIG. 11 also show other modifications from the keyboard switch circuit shown in FIG. 1.

FIG. 10 shows another one of the modifications from the keyboard switch circuit shown in FIG. 1, where the non-inverted OR gates 16a and 16b in FIG. 1 are changed to inverted OR gates 24a and 24b, associated with outputs A and B respectively. The keyboard switch circuit shown in FIG. 10 further comprises two inverters 26a and 26b each connected between the inverted OR gates 24a and 24b, respectively, and the outputs A and B similar to the circuit shown in FIG. 8.

Figure 11:
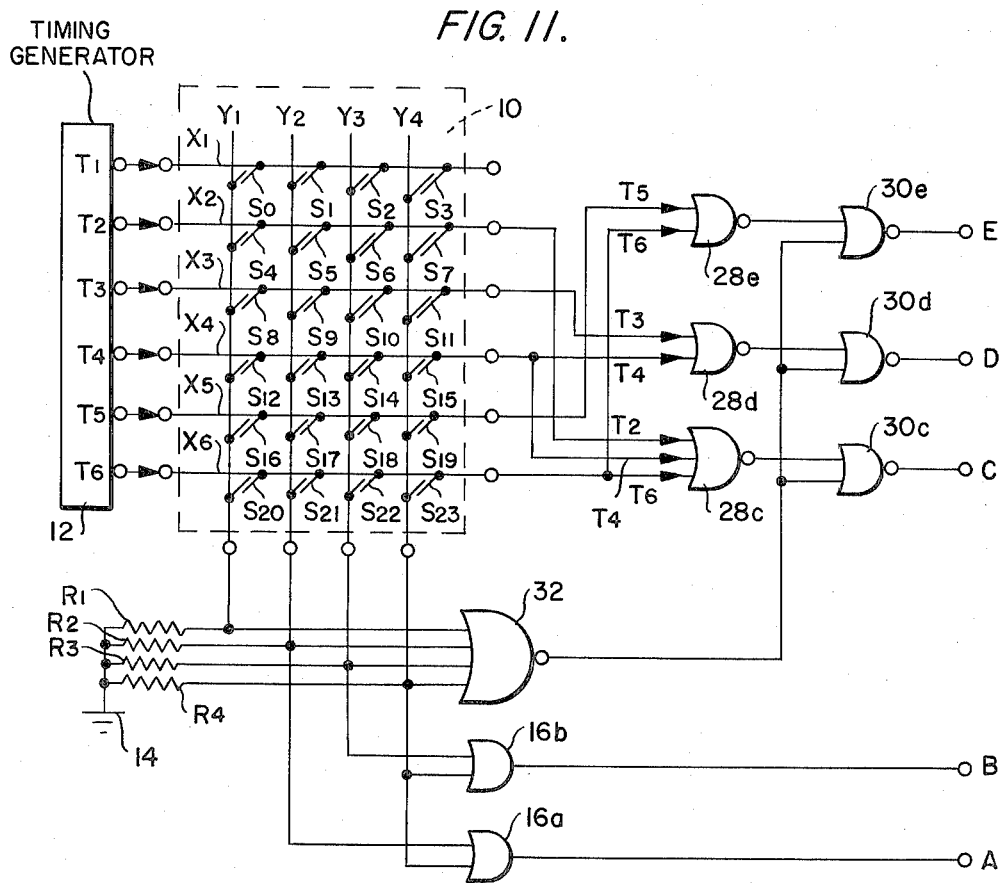

FIG. 11 shows still another modification from the keyboard switch circuit shown in FIG. 1. The circuit shown in FIG. 11 is different from the circuit shown in FIG. 8 in that the gates 16a and 16b for taking the A and B bit outputs out are non-inverted OR gates like the circuit shown in FIG. 1. As a result, the circuit shown in FIG. 11 does not need any inverters.

Figure 12:
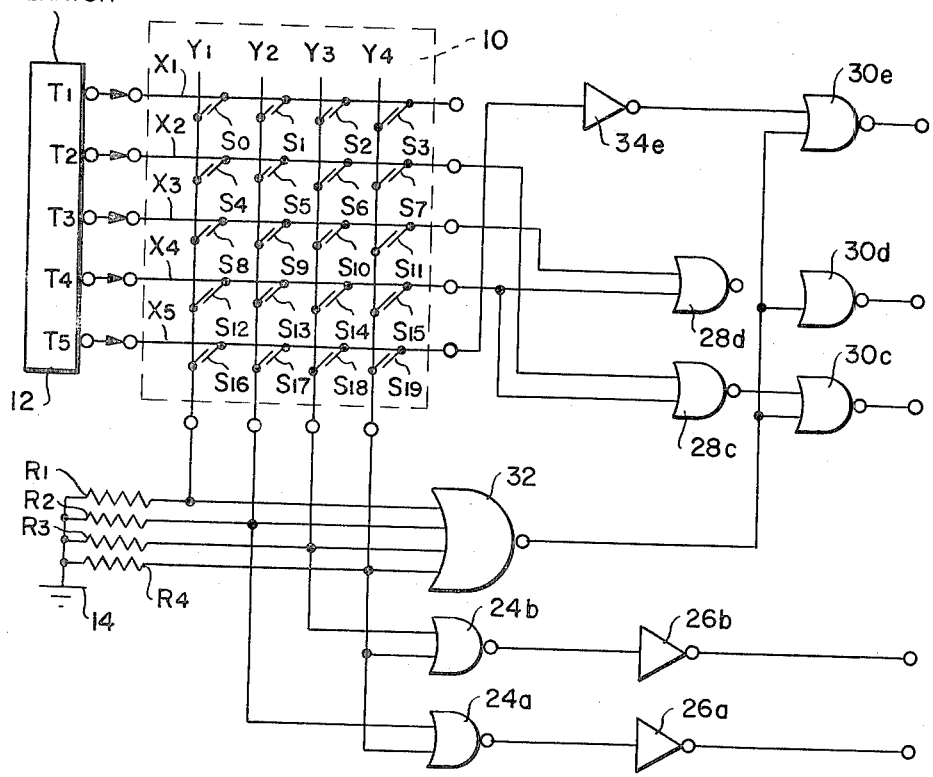
FIG. 12 to FIG. 14 show modifications from the keyboard switch circuit shown in FIG. 3.
Figure 13:
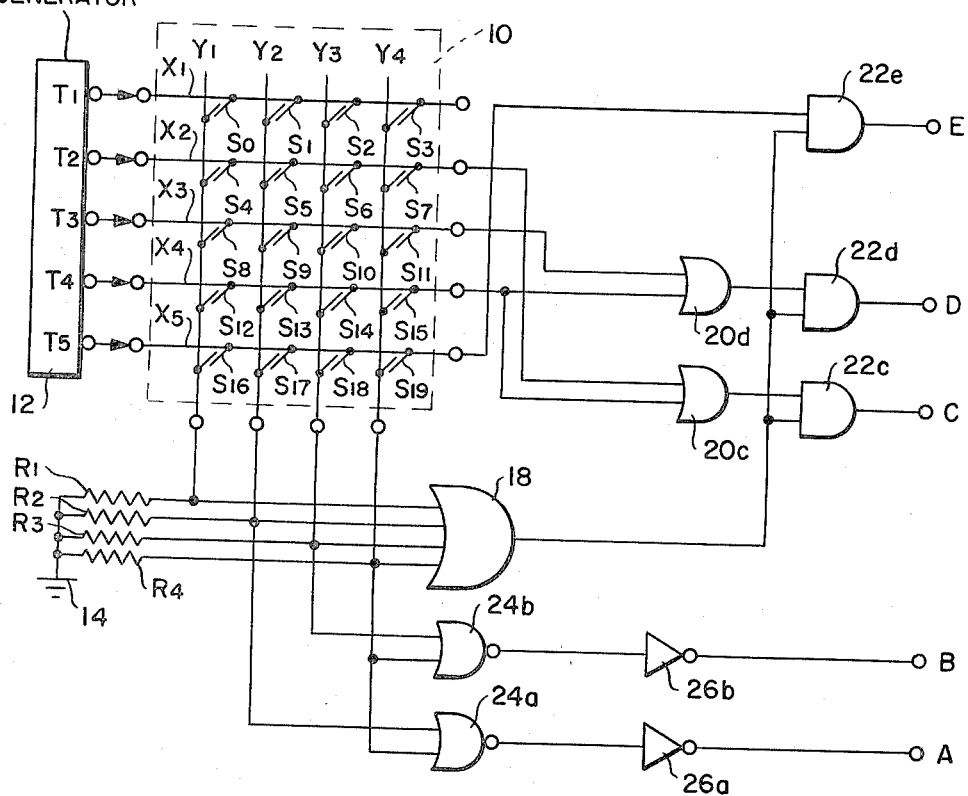
Figure 14:
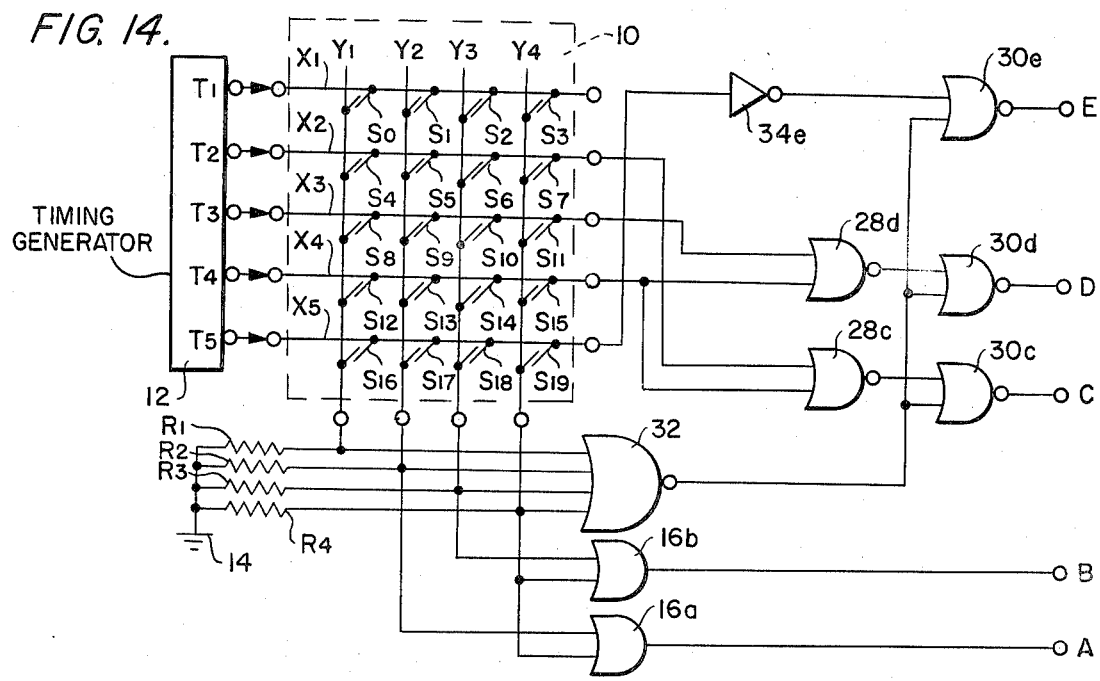

Further, FIG. 12 to FIG. 14 show the various modifications from the keyboard switch circuit shown in FIG. 3.

FIG. 12 shows the keyboard switch circuit where all of the gates are inverted OR gates, similar to FIG. 8. The circuit shown in FIG. 12, however, further comprises another inverter 34e connected between the inverted OR gate 30e and the row $X_5$. This inverter has the same effect as inverters 26a, 26b in FIG. 8.

FIG. 13 shows the keyboard switch circuit where the non-inverted OR gates 16a, and 16b in FIG. 3 are changed to inverted OR gates 24a, 24b, and further comprises two inverters 26a, 26b, similar to FIG. 10.

FIG. 14 shows the keyboard switch circuit where the circuit is different from the circuit shown in FIG. 12 in respect to the gates 16a, 16b for taking the A and B bit outputs which are non-inverted OR gates like the circuit shown in FIG. 3.

Figure 15:
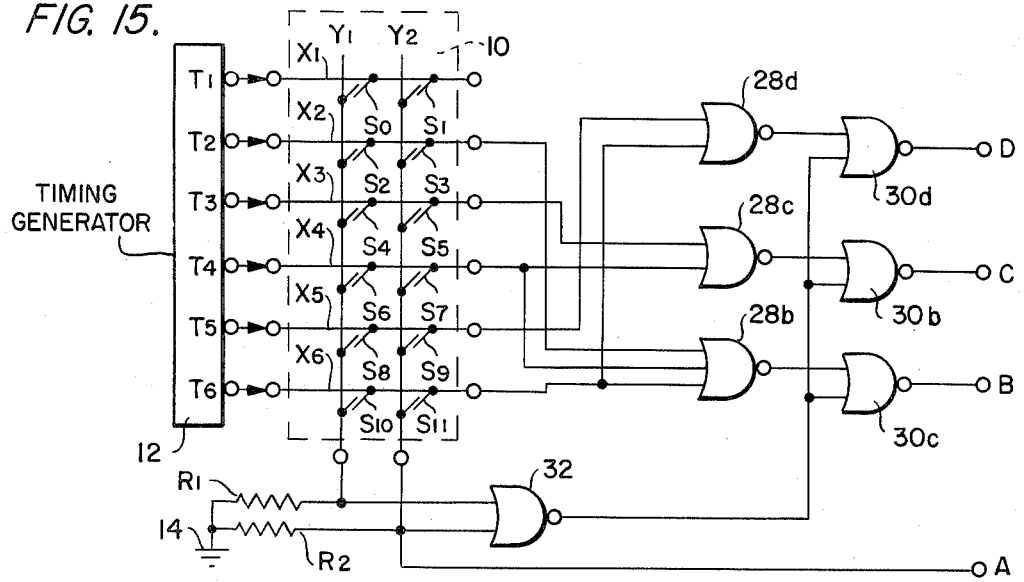
FIG. 15 shows a modification from the keyboard switch circuit shown in FIG. 4.

FIG. 15 shows the modification from the keyboard switch circuit shown in FIG. 4, where all of the gates are inverted OR gates.

Figure 16:
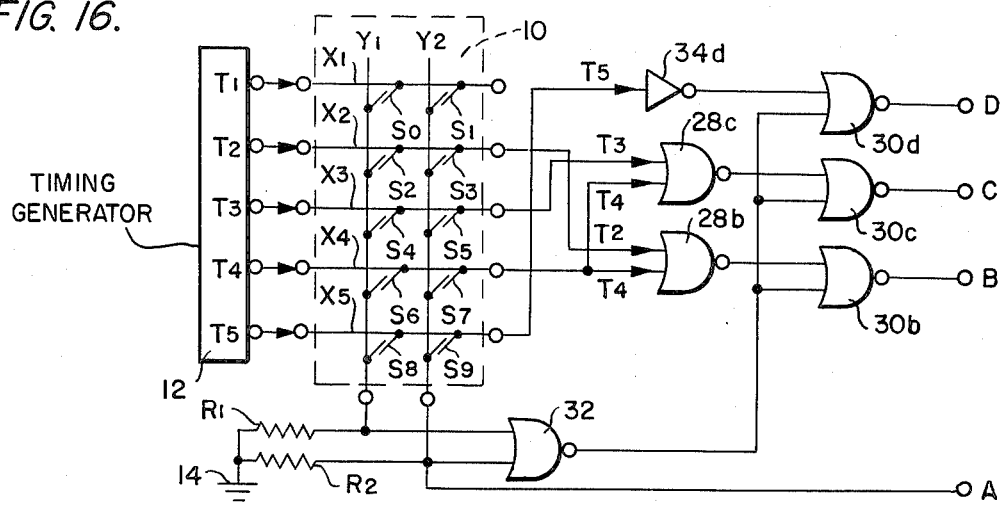
FIG. 16 shows a modification from the keyboard switch circuit shown in FIG. 5.

FIG. 16 shows the modification from the keyboard switch circuit shown in FIG. 5, where all of the gates are inverted OR gates, and an inverter 34d is connected between the inverted OR gate 30d and the row $X_5$.

Figure 17:
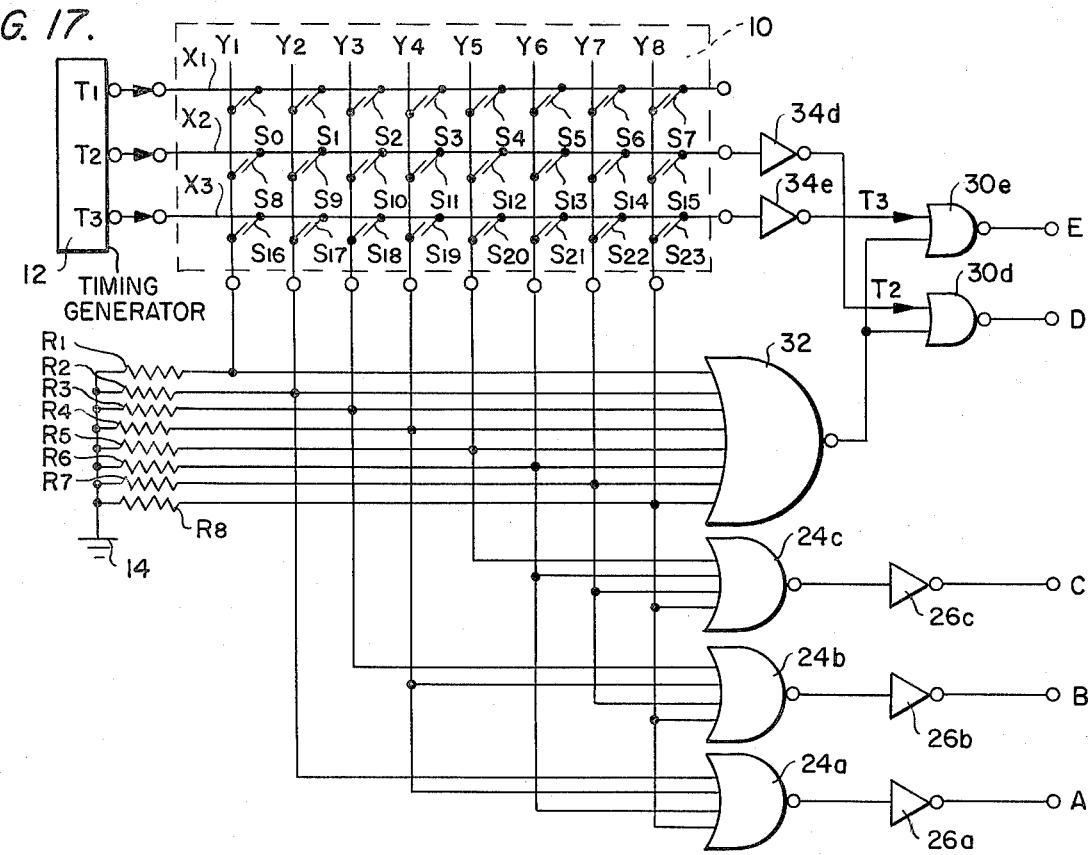
FIG. 17 to FIG. 19 show modifications from the keyboard switch circuit shown in FIG. 6.
Figure 18:
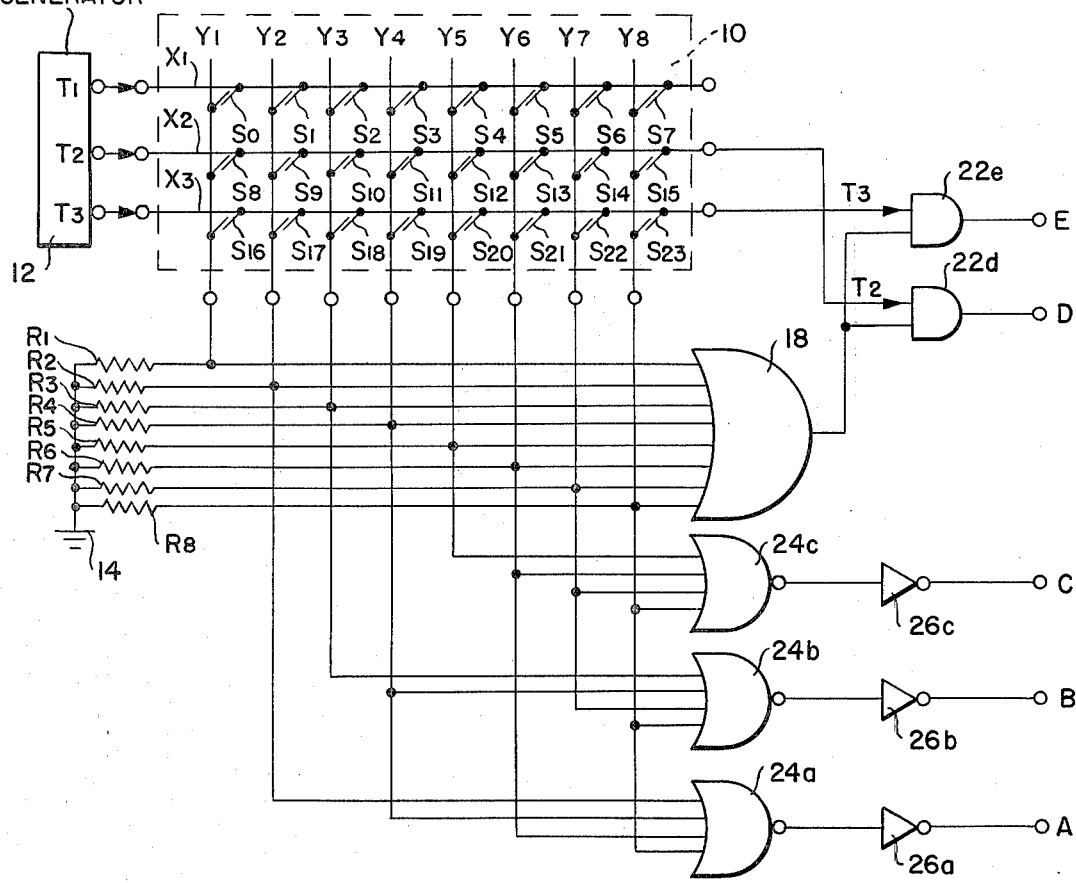
Figure 19:
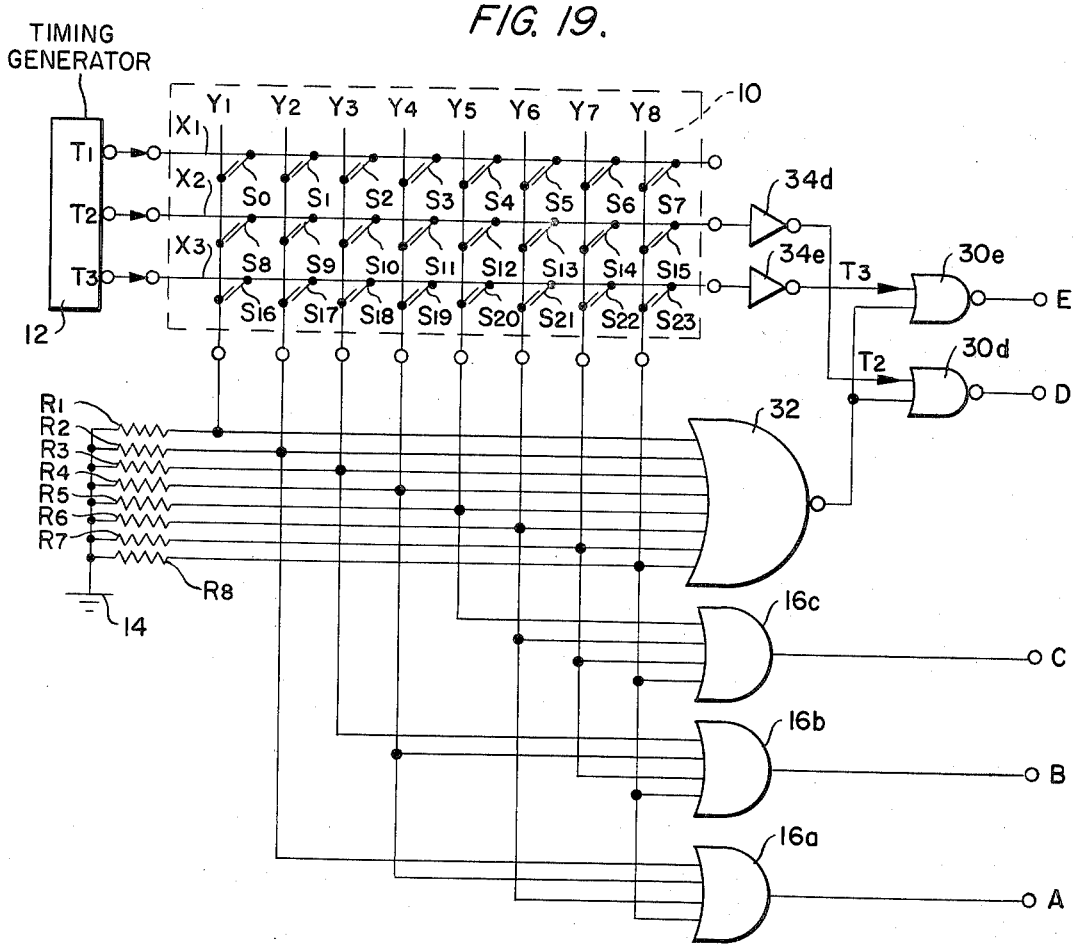

FIGS. 17 to 19 show various modifications from the keyboard switch circuit shown in FIG. 6. FIG. 17 shows the keyboard switch circuit where all of the gates are inverted OR gates, and inverters 26a, 26b, 26c, 34d and 34e are required as explained above.

FIG. 18 shows the keyboard switch circuit which is different from the circuit shown in FIG. 6 in that the gates for taking the bit outputs A, B and C associated with the columns are inverted OR gates 24a, 24b and 24c. As a consequence, the circuit shown in FIG. 18 further comprises inverters 26a, 26b and 26c.

FIG. 19 shows the keyboard switch circuit which is different from the circuit shown in FIG. 17 in the respect that the gates for taking the bit outputs A, B and C are non-inverted OR gates.

Figure 20:
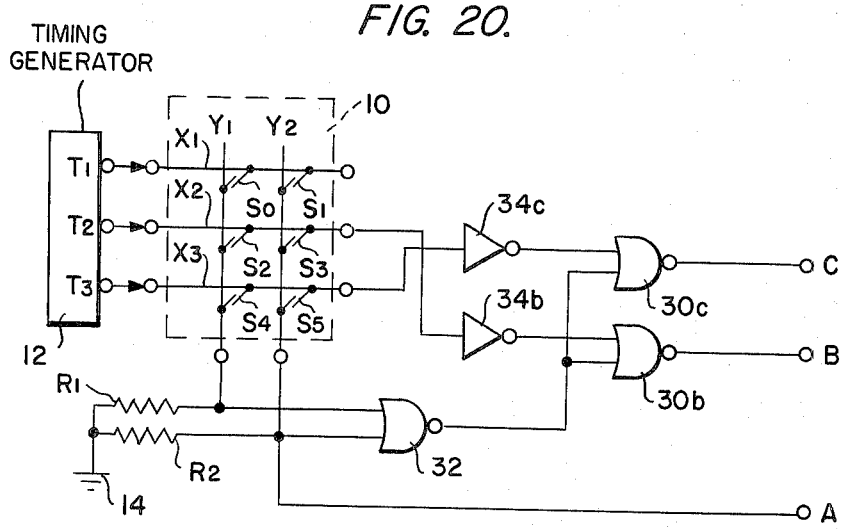
FIG. 20 shows a modification from the keyboard switch circuit shown in FIG. 7.

FIG. 20 also shows the modification from the keyboard switch circuit shown in FIG. 7, where all of the gates are inverted OR gates, and inverters 34b and 34c are required as explained above.

What is claimed is:
1. A keyboard switch circuit comprising:
   a switch matrix circuit having $2^m$ columns and $(2^{n-1}+2)$ to $2^n$ rows, where m and n represent positive integers greater than or equal to 2, and a plurality of key switches, each key switch being connected across a particular one of said columns and a particular one of said rows:
   circuit means for sequentially applying pulses to the respective rows;
   a first set of m logic gates each connected to selected ones of $2^{m-1}$ columns;
   a logic circuit having $2^m$ inputs each connected to a different one of said columns;
   a second set of n logic gates each connected to a selected one or ones of the rows;
   a third set of n logic gates each having first and second inputs, said first inputs of said third set of logic gates each being connected to the output of a different one of the second set of logic gates, and said second inputs being connected to the output of said logic circuit having $2^m$ inputs, whereby each logic gate of said third set of logic gates in ON only when the logic state of the gate of the second set of logic gates connected to the logic gate and the logic state of the logic circuit having $2^m$ inputs are coincident with each other; and (m+n) outputs each producing a different digit of a binary coded signal associated with the operation of a specific key switch, in which m outputs are the respective outputs of the first set of logic gates and n outputs are the respective outputs of the third set of logic gates.

2. A keyboard switch circuit according to claim 1 wherein said logic circuit having $2^m$ inputs and each gate in said second set of logic gates include non-inverted OR gates, and each gate in said third set of logic gates includes a non-inverted AND gate.

3. A keyboard switch circuit according to claim 2 wherein each gate in said first set of logic gates includes an OR gate.

4. A keyboard switch circuit according to claim 1 wherein each gate in said first set of logic gates includes an inverted OR gate, and wherein the circuit further comprises a set of m inverters connected to respective ones of said inverted OR gates.

5. A keyboard switch circuit according to claim 1 wherein said logic circuit having $2^m$ inputs, each gate in said second set of logic gates and each gate in said third set of logic gates include inverted OR gates.

6. A keyboard switch circuit according to claim 5 wherein each gate in said first set of logic gates includes a non-inverted OR gate.

7. A keyboard switch circuit according to claim 5 wherein each gate in said first set of logic gates is an inverted OR gate; and wherein the switch circuit further comprises a set of m inverters each connected to an output of a different one of said inverterd OR gates in said first set.

8. A keyboard switch circuit comprising:
a switch matrix circuit having $2^m$ columns and $(2^n+1)$ rows, where m and n represent positive integers greater than or equal to 2, and a plurality of key switches, each key switch being connected across a particular one of said columns and a particular one of said rows;
circuit means for sequentially applying pulses to the respective rows;
a further set of m logic gates each connected to selected ones of $2^{m-1}$ columns;
a logic circuit having $2^m$ inputs each connected to a different one of said columns;
a second set of n logic gates each connected to a selected one or ones the rows;
a third set of (n+1) logic gates each having first and second inputs, said first inputs of n of said third set of logic gates each being connected to a different one of the second set of logic gates, said first input of said remaining one logic gate being directly connected to one of said rows and said second input of all said logic gates of said third set being connected to the output of the logic circuit having $2^m$ inputs whereby each logic gate of said third set of logic gates is ON only when the logic state of the gate of the second set of logic gates connected to the logic gate of said third set of logic gates and the logic state of the logic circuit having $2^m$ inputs are coincident with each other; and (m+n+1) outputs each producing a different digit of a binary coded signal associated with the operation of a specific key switch, in which m outputs are the respective outputs of the first set of logic gates and (n+1) outputs are the respective outputs of the third set of logic gates.

9. A keyboard switch circuit according to claim 8 wherein said logic circuit having $2^m$ inputs and each gate in said second set of gates include non-inverted OR gates, and each gate in said third set of logic gates includes a non-inverted AND gate.

10. A keyboard switch circuit accordng to claim 9 wherein each gate in said first set of logic gates includes a non-inverted OR gate.

11. A keyboard switch circuit according to claim 9 wherein each gate in said first set of logic gates includes an inverted OR gate, and wherein the circuit further comprises a set of m inverters each connected to an output of a different one of said inverted OR gates.

12. A keyboard switch circuit according to claim 8 wherein said logic circuit having $2^m$ inputs, each gate in said second set of logic gates and each gate in said third set of logic gates include inverted OR gates, and wherein the circuit further comprises an inverter between said remaining one logic gate and the row connected to the gate.

13. A keyboard switch circuit according to claim 12 wherein each gate in said first set of logic gates includes a non-inverted OR gate.

14. A keyboard switch circuit according to claim 12 wherein each gate in said first set of logic gates includes an inverted OR gate, and wherein the circuit further comprises a set of m inverters each connected to an output of a different one of said inverted OR gates in said first set.

15. A keyboard switch circuit comprising:
a switch matrix circuit having 2 columns and $(2^{-1}+2^n)$ to $2^n$ rows, where n represents a positive integer greater than or equal to 2, and a plurality of key switches, each key switch being connected across a particular one of said columns and a particular one of said rows;
circuit means for sequentially applying pulses to the respective rows;
a logic circuit having 2 inputs each connected to a different one of said columns;
a conductor connected to one of said columns;
a first set of n logic gates each connected to a selected one or ones of the rows;
a second set of n logic gates each having first and second inputs, said first inputs of said second set of logic gates each being connected to the output of a different one of the first set of n logic gates and said second input of each of said second set of logic gates being connected to the output of said logic circuit having 2 inputs, whereby each logic gate is ON only when the logic state of the gate of the first set of logic gates connected to the logic gate and the logic state of the logic circuit having 2 inputs are coincident with each other;
and
(n+1) outputs each producing a different digit of a binary coded signal associated with the operation of a specific key switch, in which n outputs are the respective outputs of the second set of logic gates and the remaining one output is said conductor directly connected to one of the columns.

16. A keyboard switch circuit according to claim 15 wherein said logic circuit having 2 inputs and each gate in said first set of logic gates include non-inverted OR gates, and each gate in said second set of logic gates includes a non-inverted AND gate.

17. A keyboard switch circuit according to claim 15 wherein said logic circuit having 2 inputs, each gate in said first set of logic gates and each gate in said second set of logic gates include inverted OR gates.

18. A keyboard switch circuit comprising:
a switch matrix circuit having 2 columns and $(2^n+1)$ rows, wherein n represents positive integers greater than or equal to 2, and a plurality of key switches, each key switch being connected across a particular one of said columns and a particular one of said rows;
circuit means for sequentially applying pulses to the respective rows;
a logic circuit having 2 inputs each connected to a different one of said columns;
a conductor connected to one of said columns;
a first set of n logic gates each connected to a selected one or ones of the rows;
a second set of (n+1) logic gates each having first and second inputs, said first inputs of n of said second set of logic gates each being connected to a different one of the first set of logic gates, said first input of said remaining one logic gate being directly connected to one of said rows and second input of all said logic gates of said second set being connected to the output of the logic circuit having 2 inputs whereby each logic gate is ON only when the logic state of the gate of the first set of logic gates associated with the logic gate and the logic state of the logic circuit having 2 inputs are coincident with each other; and
(n+2) outputs each producing a different digit of a binary coded signal associated with the operation of a specific key switch, in which one output is said conductor connected to one of the columns and the remaining outputs are the respective outputs of the second set of logic gates.

19. A keyboard switch circuit according to claim 18 wherein said logic circuit having 2 inputs and each gate in said first set of logic gates include non-inverted AND gates.

20. A keyboard switch circuit according to claim 18 wherein said logic circuit having 2 inputs, each gate in said first set of logic gates and each gate in said second set of logic gates include inverted OR gates.

21. A keyboard switch circuit comprising:
a switch matrix circuit having $2^m$ columns and 2 to 3 rows, where m represents positive integers greater than or equal to 2, and a plurality of key switches, each key switch being connected across a particular one of said columns and a particular one of said rows;
circuit means for sequentially applying pulses to the respective rows;
a first set of m logic gates each connected to selected ones of $2^{m-1}$ columns;
a logic circuit having $2^m$ inputs each connected to a different one of said columns;
a second set of k logic gates where k equals the number of rows minus one, each of said second set of logic gates having first and second inputs, said first inputs of said gates each being connected to a selected one or ones of the rows and said second inputs each being connected to the output of said logic circuit having $2^m$ inputs whereby each logic gate is ON only when the logic state of its first input and the logic state of the logic circuit having $2^m$ inputs are coincident with each other; and
m+k outputs each producing a different digit of a binary coded signal associated with the operation of a specific key switch, in which m outputs are the respective outputs of the first set of logic gates and the k remaining outputs are the respective outputs of said second set of logic gates.

22. A keyboard switch circuit according to claim 21 wherein said logic circuit having $2^m$ inputs include a non-inverted OR gate and each gate in said second set of logic gates includes a non-inverted AND gate.

23. A keyboard switch circuit according to claim 22 wherein said first set of logic gates includes non-inverted OR gates.

24. A keyboard switch circuit according to claim 22 wherein each gate in said first set of logic gates includes an inverted OR gate, and wherein the circuit further comprises a set of m inverters each connected to one of said inverted OR gates in said first set of logic gates.

25. A keyboard switch circuit according to claim 21 wherein said logic circuit having $2^m$ inputs and each gate in said second set of logic gates include inverted OR gates, wherein the circuit further comprises inverters each connected between respective first inputs of a different one of said inverted OR gates in said second set of logic gates and said rows connected to each of said first inputs of the inverted OR gates of said second set of logic gates.

26. A keyboard switch circuit according to claim 25 wherein each gate in said first set of OR gates includes a non-inverted OR gate.

27. A keyboard switch circuit according to claim 25 wherein each gate in said first set of OR gates includes an inverted OR gate, and wherein the circuit further comprises a set of m inverters each connected to an output of a different one of said inverted OR gates in said first set.

28. A keyboard switch circuit comprising:
a switch matrix circuit having 2 columns and 2 to 3 rows, and a plurality of key switches, each key switch being connected across a particular one of said columns and a particular one of said rows;
circuit means for sequentially applying pulses to the respective rows;
a logic circuit having 2 inputs each connected to a different one of said columns;
a conductor connected to one of said columns;
a set of k logic gates, where k equals the number of rows minus one, each of said k logic gates having first and second inputs, said first inputs each being connected to a selected one or ones of the rows and each of said second inputs being connected to the output of said logic circuit having 2 inputs whereby each logic gate is ON only when the logic state of its first input and the logic state of the logic circuit having 2 inputs are coincident with each other; and
k+1 outputs, each producing a different digit of a binary coded signal associated with the operation of a specific key switch, in which one of the outputs is said conductor directly connected to one of the columns and the remaining k outputs are the respective outputs of the set of k logic gates.

29. A keyboard switch circuit according to claim 28 wherein said logic circuit having 2 inputs includes a non-inverted OR gate and each gate in said set of k logic gates includes a non-inverted AND gate.

30. A keyboard switch circuit according to claim 28 wherein said logic circuit having 2 inputs and each gate in said set of k logic gates include inverted OR gates, and wherein the circuit further comprises inverters each connected between a different one of said respective first inputs of said inverted OR gates and said rows connected to said first inputs of said inverted OR gates.

31. A keyboard switch circuit according to any one of claims 1 to 14 and 21 to 27 wherein the jth gate in said first set of m logic gates is connected to every $2^{j-1}$ columns at invervals of $2^{j-1}$ columns, where j represents positive integer from one to m.

32. A keyboard switch circuit according to any one of claims 1 to 20 wherein the kth gate in said second set of n logic gates is connected to every $2^{k-1}$ rows at intervals of $2^{k-1}$ rows, where k represents positive integer from one to n.

33. A keyboard switch circuit according to any one of claims 1 to 14 wherein the jth gate in said first set of m logic gates is connected to every $2^{j-1}$ columns at intervals of $2^{j-1}$ columns, wherein j represents a positive integer from one to m, and wherein the kth gate in said set of n gates is connected to every $2^{k-1}$ rows at intervals of $2^{k-1}$ rows, where k represents a positive integer from one to n.

34. A keyboard switch circuit comprising:
(a) a switch matrix circuit including $2^m$ columns, where m represents a positive integer, and $(2^{n-1}+1)$ to $(2^n+1)$ rows, where n is a positive integer;
(b) key switches each connected across a different one of said columns and a different one of said rows;
(c) a circuit for sequentially applying pulses to said rows;
(d) a first set of m logic gates connected to said columns, said logic gate, if m=1, being replaced by a conductor connected to selected ones of said columns;
(e) a second set of n logic gates connected to a selected one or ones of said rows, if n>1 and if n=1, said second set of logic gates being empty;
(f) a third set of logic gates having first and second inputs, said first inputs being connected to the outputs of said second set of n logic gates or to a selected one or ones of said rows;
(g) a logic means circuit having inputs connected to each of said columns and having an output connected to each of said second inputs of said third set of logic gates; and
(h) output terminals connected to each output of said third set of logic gates and to each output of said first set of logic gates if m>1 or to one of said columns if m=1.

* * * * *

UNITED STATES PATENT AND TRADEMARK OFFICE
CERTIFICATE OF CORRECTION

PATENT NO. : 4,408,184

DATED : October 4, 1983

INVENTOR(S) : JUN ISHII

It is certified that error appears in the above—identified patent and that said Letters Patent are hereby corrected as shown below:

Claim 15, Column 10, Line 39, change "$(2^{-1} + 2^n)$" to -- $(2^{n-1} + 2^n)$ --.

Signed and Sealed this

Twenty-seventh Day of December 1983

[SEAL]

Attest:

Attesting Officer

GERALD J. MOSSINGHOFF

Commissioner of Patents and Trademarks